United States Patent
Helvajian et al.

(10) Patent No.: US 6,932,933 B2
(45) Date of Patent: Aug. 23, 2005

(54) ULTRAVIOLET METHOD OF EMBEDDING STRUCTURES IN PHOTOCERAMS

(75) Inventors: Henry Helvajian, Pasadena, CA (US); Peter D. Fuqua, Redondo Beach, CA (US); William W. Hansen, Lakewood, CA (US)

(73) Assignee: The Aerospace Corporation, El Segundo, CA (US)

(*) Notice: Subject to any disclaimer, the term of this patent is extended or adjusted under 35 U.S.C. 154(b) by 602 days.

(21) Appl. No.: 09/821,918

(22) Filed: Mar. 30, 2001

(65) Prior Publication Data

US 2002/0139769 A1 Oct. 3, 2002

(51) Int. Cl.[7] .......................... B44C 1/22; C03C 15/00
(52) U.S. Cl. .......................... 264/482; 216/55; 216/87
(58) Field of Search .................. 264/430, 405, 264/410, 402, 400, 482; 65/33.1, 33.2; 216/18, 55, 87

(56) References Cited

U.S. PATENT DOCUMENTS

| | | | | |
|---|---|---|---|---|
| 4,539,616 A | * | 9/1985 | Yuito et al. | 360/125 |
| 5,374,291 A | * | 12/1994 | Yabe et al. | 65/30.11 |
| 6,136,210 A | * | 10/2000 | Biegelsen et al. | 216/26 |
| 6,143,382 A | * | 11/2000 | Koyama et al. | 428/34.4 |
| 6,230,051 B1 | * | 5/2001 | Cormier et al. | 604/20 |
| 6,350,506 B2 | * | 2/2002 | Dickinson, Jr. | 428/156 |
| 6,678,453 B2 | * | 1/2004 | Bellman et al. | 385/129 |
| 6,783,920 B2 | * | 8/2004 | Livingston et al. | 430/322 |
| 2003/0235385 A1 | * | 12/2003 | Taylor et al. | 385/129 |

* cited by examiner

*Primary Examiner*—Steven P. Griffin
*Assistant Examiner*—Carlos Lopez
(74) *Attorney, Agent, or Firm*—Derrick Michael Reid

(57) ABSTRACT

A laser direct write method creates true three dimensional structures within photocerams using an focused pulsed ultraviolet laser with a wavelength in a weakly absorbing region of the photoceram material. A critical dose of focused laser UV light selectively exposes embedded volumes of the material for subsequent selective etching. The photoceram material exposure is nonlinear with the laser fluence and the critical dose depends on the square of the per shot fluence and the number of pulses. The laser light is focused to a focal depth for selective volumetric exposure of the material within a focal volume within the remaining collateral volumes that is critically dosed for selecting etching and batch fabrication of highly defined embedded structures.

20 Claims, 2 Drawing Sheets

EMBEDDED FABRICATION STEPS

EMBEDDED FABRICATION STEPS

EXPOSURE CRITICAL FLUENCE

PHOTOCERAM ABSORPTION SPECTRUM

ULTRAVIOLET METHOD OF EMBEDDING STRUCTURES IN PHOTOCERAMS

FIELD OF THE INVENTION

The invention relates to the field of microfabrication of glass ceramics. More particularly, the present invention relates to the manufacture of structure within photoactivable glasses and ceramics.

BACKGROUND OF THE INVENTION

The miniaturization processes of analytical microsystem instruments for chemical and biological assay are well known. For many microsystem applications, glass is the preferred material over metal, silicon, and some plastics, because of its transparency and intertness to biological contamination and to many caustic chemicals. However a preferred material, silicate glass, is not used often because of the difficulty of microfabricating embedded fluid channels and the difficulty of sealing open trench surface channels. Typically, fabrication of a channel or a tunnel requires cutting a trench out of a workpiece and sealing this trench with another piece of glass that is aligned and bonded on top of the open trench. A processing step could be eliminated and system reliability improved if tunnels and other three dimensional cavities could be embedded within a monolithic piece of glass. It is desirable to reliably form three dimensional embedded glass structures using suitable batch fabrication processing.

Microelectromechanical Systems (MEMS) typically disadvantageously uses two dimensional processing steps to form three dimensional structures in bulk materials. Much of the two dimensional processing is based on silicon processing steps. However, semiconductors are not always optimal materials for use in some MEMS applications. One alternative class of materials is photostructurable glass ceramics, also known as photocerams. These photostructurable materials are typically exposed by using ultraviolet lamps and patterns are created using shadowmasks. The glass is exposed to a critical dose and the exposed material can subsequently be converted to a crystalline phase during a heating step. Prior processes utilize lamps that have a spectral emission that overlaps the absorption region or absorption band of the photostructurable material. In this absorption region, the workpiece responds to light exposure in a way that the critical dose is constant and the product of irradience and exposure time. This would be considered a linear exposure process. Photostructurable glass ceramics are a promising class of materials for MEMS devices. Previous micromachining work with these materials used conventional two dimensional photolithography equipment and masking techniques. Microdrilling techniques have been tried for both regular glass and photoceramic glass without much success. Standard two dimensional photolithographic techniques can only form planar two dimensional structures used in MEMS fabrication processing to describe extruded shapes, features formed by projecting a two dimensional pattern on a two dimensional surface of a workpiece. Current processes can not be used to create potentially useful three dimensional photoceramic structures such as a simple buried tunnel in a monolithic material. Furthermore, photolithographic processing of a monolithic material is not amenable to undercutting of patterned structures in a way that leaves anchored or suspended structures.

One prior method selectively patterns a Foturan material workpiece. Foturan is a lithium aluminosilicate glass with trace amounts of silver, cerium and antimony. Foturan is a trademark of Schott Glass. The Foturan material is a photostructurable glass ceramic available in wafer form. Standard Foturan processing involves exposure of an ultraviolet (UV) lamp through a prepatterned shadowmask. Foturan has a strong spectral absorption band beginning at wavelengths lesser than 350 nm. Hence, lamps with a spectral emission characteristic of 270 nm to 330 nm are used to expose the Foturan material because the emission band of the lamps falls within the strong absorption band of the Foturan material. Regions of the Foturan that accumulate a sufficient dose of UV light can then be converted to a crystalline material by heating the sample and etching the exposed material. Increasing the dose is achieved by increasing the intensity of the UV lamp across the spectral emission band of the lamp and or by increasing the irradiation time. The trade between intensity and irradiation time to achieve a critical dose is inverse and first order. The cerium dopant is believed to be a photosensitizer. In the presence of ultraviolet light, $Ce^{3+}$ loses an electron to become $Ce^{4+}$. A fraction of the free electrons reduce trapped $Ag^+$ atoms to $Ag^0$. In a subsequent thermal processing during heating, silver atoms diffuse together to form clusters. If a cluster is larger than 80 Å, the cluster can provide the nucleus for the growth of crystalline phase material into an amorphous phase material. The crystalline phase material is composed largely of lithium metasilicate that is preferentially soluble in hydrofluoric (HF) acid. Soaking the sample in an HF solution results in dissolution of the exposed regions leaving unexposed patterned structures. The crystallized material is highly soluble in the HF acid so that soaking the patterned and heated workpiece in HF causes the converted regions to dissolve away leaving the unexposed glass. However, the UV exposure is commonly directed to fabricating structures showing surface relief and is unsuitable for dissolving the crystalline material embedded within the workpiece. Three dimensional structure fabrication in photocerams can be achieved using the standard method with a lamp. However, embedded structures are difficult to obtain because lamp spectra is too broad and weak for effective exposure within the workpiece. The photons in part of the UV spectral region of the lamp are readily absorbed in the material and this inundates the volume above the desired embedded volume during patterning formation. The strong absorption results in the conversion of all regions above the embedded volume to the soluble phase. Attempts to use an unfiltered lamp would convert the embedded trench structure to a trench structure open to the surface. Focusing the lamp with broad spectrum light is also unsuitable for forming a stacked embedded structure because regions above and below the volume at the depth of focus may also accumulate a dose, and over subsequent exposure operations would convert to the crystalline phase preventing the formation of precise three dimensional embedded structures. These and other disadvantages are solved or reduced using the invention.

SUMMARY OF THE INVENTION

An object of the invention is to provide a method for forming an embedded structure in a photoceramic material.

Another object of the invention is to provide a method for forming an embedded structure in a photoceramic material using focused pulsed laser ultraviolet light exposure.

Yet another object of the invention is to provide a method for forming an embedded structure in a photoceramic material using focused pulsed laser ultraviolet light exposure while the material is moved relative to the light source.

Still a further object of the invention is to provide a method for forming an embedded structure in a photoceramic material exposed to focused pulsed laser ultraviolet light having a spectra outside the absorption band of the photoceramic material.

The invention is a method for fabricating embedded structures in glass and ceramic materials that are photostructurable glass ceramic material, commonly called pyrocerams or photocerams. The photostructurable Foturan material is one preferred photoceram material, but many other glass ceramic materials are also suitable for photostructuring of embedded structures. The predetermined laser energy dose and wavelength settings are preferably applied to the Foturan pyroceram material, but the method can be generally applied to the whole class of photosensitive glasses. For the Foturan material, the laser used is a focused pulsed ultraviolet (UV) laser. The laser provides a pulsed laser beam using a lens defining a beam waist at a focal depth that is moved during exposure relative to the exposed material. The choice of the UV wavelength is critical to be effective. The wavelength is preferably at the very edge of the spectral region where photoceram transitions from being strongly absorbing to weakly absorbing. In the weakly absorbing spectral region, the wavelength of the laser is outside the strong absorption band of the photoceram material. Hence, the absorption of radiation is very small so that the process is photon inefficient but enables the controlled focused exposure of any volume including an embedded focal volume defining an embedded three dimensional structure. The focused beam illuminates the material with the intensity peaking in the focal volume. The number of pulses and pulse fluence controls the amount of the exposure dose so that the exposure outside the focal depth, that is, outside the depth of the optical field in a collateral volume is insufficient for conversion of the material to the soluble crystalline phase. Within the depth of focus region, that is, the focal volume, the combined effect of the focused laser beam fluence (Joules/cm$^2$) and the dose in terms of the number of laser pulses is beyond a critical dose that is required for conversion to the crystalline phase. The focused pulsed ultraviolet laser and a computer controlled sample positioning stage and shutter provides motion controls for moving the material relative to the focus laser beam during selective exposure of the focal volume. True three dimensional patterns can be formed by moving the sample using an XYZ positioning stage in XYZ directions. Motion and shutter operations are both computer controlled. For example, laterally moving the workpiece in the XY plane can create a tunnel, while moving vertically adding via openings to the end sections of a tunnel undercuts the structure above leaving an anchored but suspended structure. The result is an embedded microstructure or an exposed pixel defined in the focal volume.

The method can be used to create one or more stacked embedded structures. There is no critical exposure above and below depth of focus. The material is only critically exposed in the focal volume region where the administered laser dose is above a critical dose value $D_c$. Repeated exposures at different depth of focus enables the formation of stacked embedded structures. Precise structural definition is realized to create one or more embedded structures because collateral volume regions above and below the focal volume at the depth of focus do not accumulate a critical exposure dose. The critical dose is based on sufficient per pulse fluence that is the energy per unit area in a single pulse and the number of pulses. For a given laser pulse width and wavelength, the per pulse fluence is proportional to irradience. The exposure process is a nonlinear optical process, that is, the critical dose $D_c$ is a nonlinear function of the per-pulse laser fluence. That is, the critical dose required for conversion to the crystalline phase is both a function of the per pulse fluence and the number of applied pulses. The dose dependence is nonlinear in per pulse fluence and is cumulative. The most intense portion of the focused pulsed laser light is sufficient to deliver the critical dose over a predetermined number of pulses. Exploiting the nonlinear aspect of the exposure process allows for creation of stacked structures at any desired focal depth. The wavelength is in the weak absorption region so that a critical dose is not delivered to the collateral volume where the pulsed laser light is not focused and not as intense as in laser focal volume where the laser light provides a critical dose. Hence, the pulsed laser light has a wavelength in the weak absorption region of the photoceram so that the pulsed laser light passes through the collateral volume without delivering a critical dose and without producing crystallization outside the focal depth. The pulsed laser light is focused and intensely converges for accumulation of the critical dose only in the focal volume for selective critical dose exposure at the focal depth in the photoceram enabling precise embedded volumetric critical dose exposure. Exposing the photoceram material with higher fluence focused light provides a sharp selective contrast between the collateral volume and the focal volume. During fabrication, the method provides a trade off between laser fluence and the number of applied pulses. The critical dose of pulsed UV light provides the embedded growth of an etchable crystalline phase of the photoceram. By exposing bulk photoceram material to a fluence gradient for a variety of pulse train lengths, and by measuring the dimensions of the etched region, the proper critical dose can be determined in terms of wavelength, intensity and the number of pulses.

A crystallization boundary is created in the photostructurable glass where the critical dose is and is not exceeded. Above the critical dose $D_c$, the photostructurable glass is crystallized for forming a latent image in the focal volume. Below the critical dose $D_c$, no image is formed and hence no crystallization occurs in that region of the photostructurable glass. The crystallization boundary separates the collateral volume from the focal volume. The crystallized glass that was subjected to a dose higher than $D_c$ in the focal volume is etched away from the collateral volume of photostructurable material. The under exposed uncrystallized photostructurable glass in the collateral volume that did not have a critical exposure remains after etching. The critical dose $D_c$ is required to create a density of nuclei large enough to result in an interconnected network of crystallites. The crystallites are etched away in a subsequent etching process. The density of nucleation sites is proportional to the dose and the critical dose will be a function of the material composition and process parameters. The critical density of sites should be fluence dependent, such that, $\rho = KF^m N$ Where $\rho$ is the density of nuclei, F is the per-pulse fluence, m is the power dependence, N is the number of pulses, and K is a proportionality constant. A dose, D is equal to $\rho/K$ so that $D = F^m N$. For a given number of pulses, the critical dose $D_c$ will correspond to a critical fluence $F_c$, that is, $D_c = F_c^m N$. When a focal volume of embedded photoceram material is exposed above the critical dose, the focal volume can then be developed, etched, and vacated, the vacant cavity defining the embedded structure.

The method enables the formation of embedded microstructures, microcavities in a particular class of glass and ceramic materials. The method also enables the patterned undercutting of unexposed structures resulting in the fabrication of suspended or supported glass and ceramic microstructures. A micromachining station includes a pulsed laser that provides a focused laser beam and the workpiece including the photoceram material. The laser can be moved relative to a stationary workpiece, or equivalently, the workpiece can be moved relative to the laser beam, both according to a predefined computer program. The exposure process is maskless and amenable to rapid batch fabrication of the embedded structures because the only serial aspect of the process is the exposure step. A parallel batch fabrication process can be used in the actual material removal step. Depth control of the laser light is achieved by the proper choice of exposure wavelength and focusing optics. As the laser wavelength is tuned into the weak absorption end of the UV absorption band of the photoceram material, the absorption of laser light decreases in the collateral volume and the penetration depth increases into the focal volume for crystallization of embedded structures. The pulsed laser UV light beam can be shaped resulting in structures that will retain the beam shape. For example, a collimated beam can result in a cylindrical hole. A focused beam can result in either a cone section, or a hyperboloid structure.

The method is a direct write three dimensional volumetric lithography method for selective removal of the embedded photoceram material. The method is photon efficient in the sense that the laser must only provide the energy to form a latent image. It does not need to provide the energy to break atomic bonds and remove unwanted material from the workpiece. Direct write tools, such as computer aided manufacturing programs and fixtures coupled to a pulsed UV laser are used in a micromachining station for rapid batch processing and enhanced depth control. The pattern exposure and dissolving steps can be done across an entire wafer for batch processing. These and other advantages will become more apparent from the following detailed description of the preferred embodiment.

DETAILED DESCRIPTION OF THE PREFERRED EMBODIMENT

Figure 1:
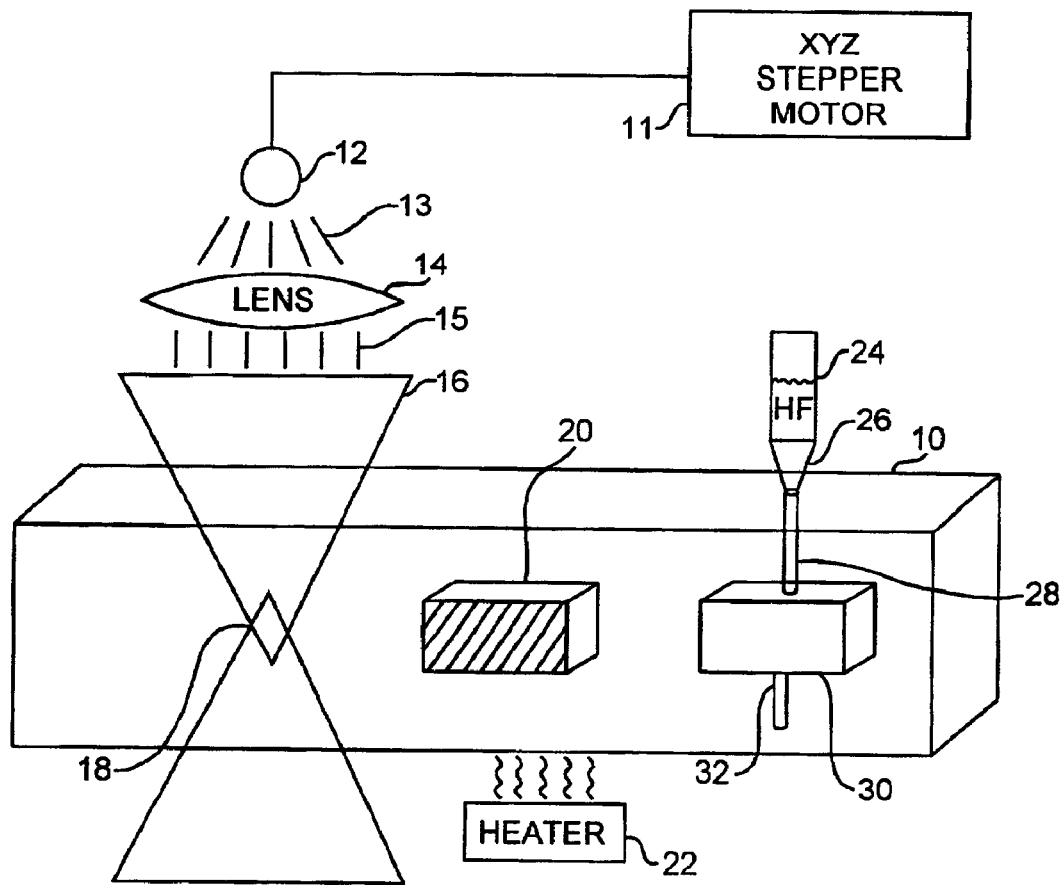
FIG. 1 depicts embedded processing steps in apparatus form.

An embodiment of the invention is described with reference to the figures using reference designations as shown in the figures. Referring to the Figures, a photoceram material sample 10 is moved using a stepper motor 11 relative to a pulsed ultraviolet (UV) laser 12 radiating pulsed laser light 13 through a microscope object lens 14 providing refracted light 15 that is focused into a focused beam 16 having a focal region 18 within the sample 10. Alternatively, the photoceram material sample 10 can remain fixed and the focused laser beam 16 can be made to move. The outcome is the same. The sample material is preferably Foturan, but other photostructurable photocerams may be used. The focal region 18 has a beam waist that partially defines a focal depth into the sample 10. The sample 10 is shown having a exposed focal volumetric region 20 through which the focal region 18 had been previously stepped. The volumetric region 20 defines a focal volume of the material that has received a critical dose of illumination of the pulse laser light. The sample 10 comprising the exposed volumetric region 20 is then heated using a heater 22 and a programmed heating and cooling protocol. A hydrofluoric (HF) acid source 24 delivers a HF acid solution through an acid conduit 26. The HF acid source 24 can transport the acid to the conduit 26 either via agitation of the surrounding liquid or by high pressure focussed jets. The sample may be processed to have a top via 28 above the focal volume 30 and a bottom via 32 below the focal volume 30. The vias 28 and 32 could be formed by drilling or micromachining. The laser 12 could also be used to form the top via 28 and bottom via 32 as well as the focal volume 30 using the laser exposure technique. The focal volume region 20 defines the embedded structure 30. The HF acid preferentially dissolves that heated crystalline material within focal volume. The dissolved heat processed crystalline material is flushed out of the focal volume 20 from the embedded structure 30 through a bottom via 32.

The laser beam 13 has a Gaussian spatial profile and a predetermined number of pulses to deliver a critical dose to the sample 10. The illumination source 12 may be a diode pumped Nd:YAG laser that can be frequency tripled to 355 nm. The pulse length may be for example 8 ns in duration. The beam passed through the quartz object lens 14 providing an exemplar 17 mm focal length. Processing of the photoceram material sample 10 results in a sharp differentiation between crystalline focal volumes 20 and the remaining glassy collateral volumes. As the focusing beam 15 converges and diverges it generates a fluence gradient that increases and decreases vertically through the Z direction through the sample 10. Where the beam intensity exceeds the critical fluence at the boundary of the focal volume 20, crystallization is sharply defined. The laser fluence is at a peak intensity at the beam waist 18 defined to be the focal point depth along the propagation Z axis. Along the vertical Z axis, the fluence reaches a maximum in the focal volume where a critical dose is delivered after an accumulation of a sufficient number of laser pulses. The spot size of the laser beam 16 at the beam waist 18 can be measured using the knife edge method that measures power in the beam as a function of the distance that a blade encroaches into the beam. By fitting knife edge method data to a Gaussian profile, the spot size can be determined using $P/P_o = [\text{erfc}^{\sqrt{(2x)/\omega_o}}]/2$, where P is the optical power on the detector, $P_o$ is the unimpeded power on the detector, x is the position of the knife's edge, and $\omega_o$ is the Gaussian spot size. The material may be exposed with a wide range of spot sizes including an exemplar $1/e^2$ spot radius of 0.35 mm. With a Gaussian fluence profile for a predetermined spot size at a predetermined wavelength, the per pulse fluence at the etch boundary and the number of pulses can be determined from a log—log plot of the exposure critical fluence.

Figure 2:
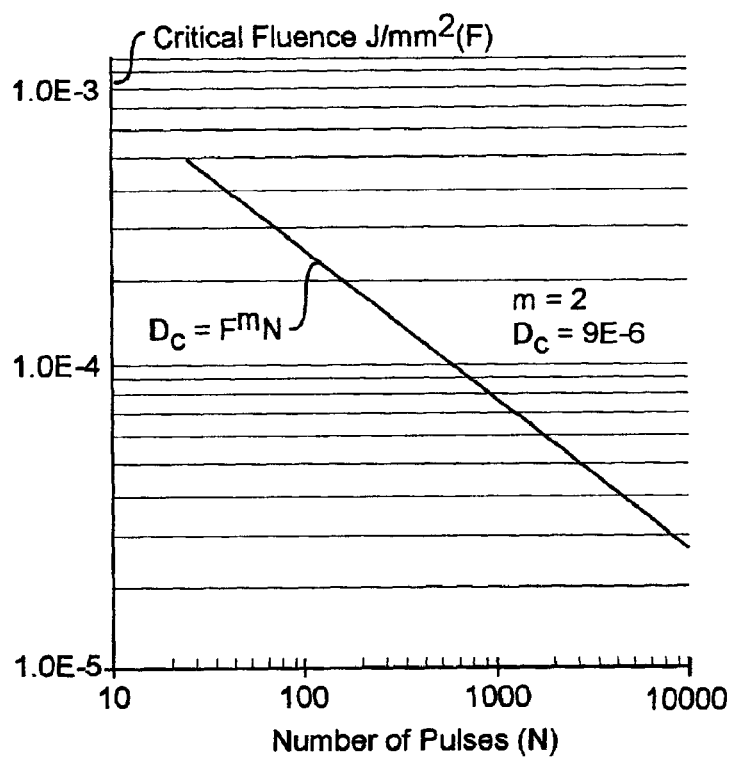
FIG. 2 is an exposure critical fluence graph.
Figure 3:
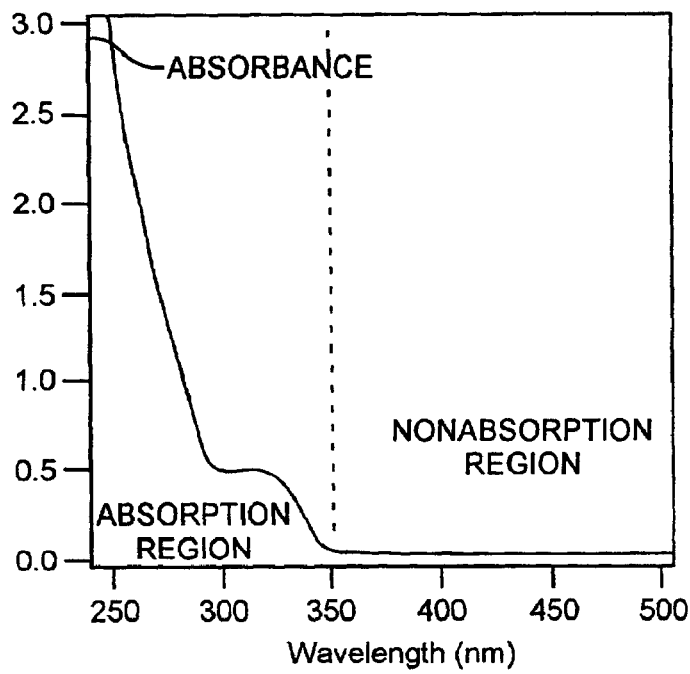
FIG. 3 is a Foturan photoceram absorption spectrum graph.

Referring to all of the figures, and more particularly to FIG. 2, the log—log plot of the exposure critical fluence $F_c$ can be used to determine the critical dose at the etch boundary. At the desired wavelength and at a desired spot size, the exposure critical fluence plot can be used to determine the number of pulses at a respective fluence level necessary to provide the critical dose. The exposure critical fluence plot for an exemplar 355 nm wavelength is shown. When plotted on the log—log graph, the slope corresponds to the negative reciprocal of m, the order of the fluence dependence. The parameters for the log—log plot for Foturan are m=2 and $D_c = 9 \times 10^{-6}$ $J^2/mm^4$. Dc is a function of many parameters including the laser pulse duration. The per pulse fluence dependence is a squared term at the selected wavelength. The m=2 nonlinearity of the fluence indicates that the photoceram material can be exposed by a low intensity lamp at the expemplar wavelength but it may take an unreasonable amount of time. In the case of unfocused light and with $F_0$ being a peak fluence incident upon the sample, light is attenuated according to Beer's Law and the fluence in the volume to be etched is $F_c=F_0\exp(-\alpha z_c)$ where $\alpha$ is the absorption coefficient and $z_c$ is the etchable depth so that $z_c=-[\ln(F_o{}^m N)-1\ n(D_c)]/\ \alpha m$. The critical dose is a nonlinear function of fluence. The slope of the log—log plot is linear within a range of a suitable number of pulses, for example, between 100 and 10000 pulses, where m=2. However, outside of this number of pulses range, the slope of the log—log plot may or may not abruptly change when using an extreme number of fewer or more pulses for shorter and longer pulse trains. It is desirable to operate with a wavelength where the photostructurable glass-ceramic responds to light with a nonlinear dependance on per pulse fluence and where the photostructurable glass-ceramic is weakly absorbing. At wavelengths where the material has significant absorption, the absorption coefficient can increase with increasing dose. For example, for a small number of pulses of 266 nm light, the material might have an absorption coefficient of 3.4 per millimeter and for a large number of pulses, the absorption coefficient might be 5.4 per millimeter. Within an acceptable range of pulses, the log—log plot has a linear slope for determining a critical dose that is highly predictable. The number of pulses can be delivered in a pulse train as a pulsed illumination sequence for pixelized pattern exposure of the sample 10.

The photoceram material can be developed using a programmable furnace or heater 22. The temperature can be increased at 5° C./min to 500° C. and held for an hour. At this temperature, the latent image is developed by diffusion of neutral silver atoms that form silver clusters in the critically exposed focal volume. The temperature is raised again preferably to 605° C. at 3° C./min and held for another hour. At this higher temperature, a crystalline phase is nucleated from the vitreous phase at the silver clusters. The crystalline phase, also known as the ceramic phase, is slightly less dense than the amorphous phase, so there is a small expansion associated with the devitrified regions. The temperature is sufficient for softening of the amorphous phase so the glass flows slightly to accommodate the expanded volume. After completing the nucleation and growth steps, a Foturan sample has an image consisting of brown crystalline focal volumes 20 in a clear amorphous matrix of the collateral volume.

In the crystalline phase, the sample material is more rapidly soluble in hydrofluoric acid 24 than the surrounding material in the collateral volume. In a 5% solution of hydrofluoric acid 24 at room temperature, the etch ratio is about 50:1. With an exposure using a 355 nm Gaussian beam, the dark focal volume region 20 is crystalline and colored by silver clusters after an appropriate thermal treatment. Where the material 10 did not exceed the critical dose, the crystallite density is insufficient to form an etchable volume. When the material is exposed by a focused Gaussian beam, the dose will be maximized at the center of the focal region. The dose is reduced in every direction from that point. Where the dose drops to less than the critical dose, the crystallite density will be too sparse to allow further etching. This etch boundary sharply defines the embedded cavity. The embedded cavity 30 may be few microns in diameter with a smooth or rough texture. After the sample is exposed and heated, the sample is then etched. The size of the etched focal volume can then be determined by optical microscopy to confirm that the wavelength and number of pulses are suitable for providing the critical dose at the focal depth.

The focal volume is preferably defined using computer aided manufacturing. The laser can be step moved relative to a sample of photoceram or alternatively the sample can be step moved relative to the laser. In the case of step moving the laser, at each step, the laser delivers a pulsed illumination sequence comprising a pulse train of a predetermined number of pulses that critically expose the photoceram at the focal depth in a small pixelized volume. The laser is then repeatedly step moved, and another pulse train of exposure is delivered at each step, so that a large focal volume is created comprising a plurality of the pixel volumes. In this manner, computer controlled steps are used to form any size embedded volume 30 as well as top and bottom vias 28 and 32. Computer controls are well suited for fabricating stacked embedded structure across an entire wafer for cost effective batch processing.

The method is directed to exposing photoceram material by a focused pulsed UV laser having a wavelength in the weak absorption region but with the laser light focused to expose the material with a critical dose in a focal volume using a predetermined number of focused laser pulses that forms an embedded latent image which, can be transformed into an embedded crystalline region following a proper heat treatment. The method can be used for forming embedded tubes, tunnels, cone, hyberboloids, and other shapes with a single exposure inside a monolithic glass sample. The fabrication of embedded three dimensional microstructures in glass and ceramic materials may be critical to the future development of photonics and communication systems, display screens, nanosatellites, microthrusters, microlamps, biocompatible chemical instruments, microoptics, and microfluidics. Many of these applications will benefit from a process for embedding structures with features sizes in the tens of micrometers. Those skilled in the art can make enhancements, improvements, and modifications to the invention, and these enhancements, improvements, and modifications may nonetheless fall within the spirit and scope of the following claims.

What is claimed is:

1. A method of vacating a portion of a photoceram, the method comprising, generating a laser beam at a predetermined wavelength within a weak absorption region of the photoceram, focusing the laser beam into a beam waist at a focal depth into the photoceram, illuminating the photoceram by the laser beam to expose a focal volume of the photoceram at a focal depth where the laser beam converts the photoceram into an amorphous exposed material in the focal volume, heating the amorphous exposed material for forming crystallized material from the amorphous exposed material in the focal volume, and dissolving the crystallized material in an acid for evacuating crystallized material from the focal volume and creating a focal volume vacancy defining the portion.

2. The method of claim 1 wherein, the portion serves to suspend another portion of the photoceram.

3. The method of claim 1 wherein, the portion serves to undercut another portion of the photoceram.

4. A method of forming a three dimensional embedded structure in a photoceram, the method comprising, generating a laser beam at a predetermined wavelength within a weak absorption region of the photoceram, focusing the laser beam into a beam waist at a focal depth into the photoceram, illuminating the photoceram by the laser beam to expose a focal volume of the photoceram at a focal depth where the laser beam converts the photoceram into an amorphous exposed material in the focal volume, heating the amorphous exposed material for forming crystallized material from the amorphous exposed material in the focal volume, and dissolving the crystallized material in an acid for evacuating crystallized material from the focal volume and creating a focal volume vacancy defining the three dimensional embedded structure.

5. The method of claim 4 wherein, the photoceram is a lithium aluminosilicate photostructable glass ceramic material, and the predetermined wavelength is greater than 350 nm.

6. The method of claim 4 wherein, the predetermined wavelength is an ultraviolet wavelength.

7. The method of claim 4 wherein the illuminating step comprises the steps of, exposing the photoceram at the predetermined wavelength for a predetermined number of pulses to provide a critical dose at the focal depth for creating a pixelized volume of amorphous exposed material, moving the photoceram a predetermined step distance relative to the laser beam, and repeating the exposing and moving step a plurality of times for creating a respective plurality of pixelized volumes forming the focal volume.

8. The method of claim 7 wherein, the predetermined number of pulses is between 100 and 10000 for delivering the critical dose for converting the photoceram into the amorphous exposed material.

9. The method of claim 4 wherein the dissolving steps 4 further comprising the steps of, forming a top via in the photoceram for communicating the acid into the focal volume for dissolving the crystalline material in the focal volume, dissolving the crystalline material in the focal volume with the acid communicated into the focal volume through the top via, forming a bottom via in the photoceram for vacating dissolved crystalline material out of the focal volume, and vacating the dissolved crystalline material through the bottom via.

10. The method of claim 9 wherein the forming steps for forming the top and bottom via comprise the steps of, exposing the photoceram in a top region for creating a top via volume of amorphous expose material for defining the top via, exposing the photoceram in a bottom region for creating a bottom via volume of amorphous expose material for defining the bottom via, the baking step serving to bake the amorphous exposed material in the top and bottom via volumes into crystallized material, the dissolving step serving to dissolve the crystallized material out of the top and bottom volumes for forming the top via and bottom vias.

11. The method of claim 4 wherein, the illumination step exposes the focal volume during an exposure time at an intensity level, the intensity level and the exposure time provide an exposure dose above a minimum critical dose necessary for converting the photoceram into the amorphous exposed material, and the minimum critical dose is a nonlinear function of the intensity level.

12. The method of claim 4 wherein, the laser is a pulsed laser, the laser beam is a pulsed laser beam having a predetermined number of pulses, the illumination step exposes the focal volume for the predetermined number of pulses having a per pulse fluence level over a predetermined pulse width time, the per pulse fluence level and the predetermined number of pulses provide an exposure dose above a minimum critical dose necessary for converting the photoceram into the amorphous exposed material, and the minimum critical dose is a nonlinear function of the per pulse fluence level.

13. A method of forming a three dimensional embedded structure in a photoceram, the method comprising, generating a pulsed laser beam at a UV wavelength within a weak absorption band of the photoceram, focusing the laser beam into a beam waist at a focal depth into the photoceram, exposing the photoceram at the UV wavelength a predetermined number of pulses at focal depth for creating a pixelized volume of amorphous exposed material, moving the photoceram a predetermined step distance, and repeating the exposing and moving step a plurality of times for creating a respective plurality of pixelized volume forming a focal volume, heating the photoceram to heat the amorphous exposed material in the focal volume to bake the amorphous material into a crystallized material, and dissolving the crystallized material in an acid for evacuating the crystallized material from the focal volume creating a focal volume vacancy defining the three dimensional embedded structure.

14. The method of claim 13 wherein, the photoceram is a lithium aluminosilicate photostructable glass ceramic material, the ultraviolet wavelength is 355 nm, and the number of pulses is between 100 and 10000.

15. The method of claim 13 wherein, all the steps are repeated for forming a plurality of embedded structures.

16. The method of claim 13 wherein the embedded structure is an undercut structure.

17. The method of claim 13 further comprising the step of, agitating the acid for transporting the acid through the top via into the focal volume.

18. The method of claim 13 further comprising the step of, pressurizing the acid for transporting the acid through the top via into the focal volume.

19. The method of claim 13 wherein the illumination laser beam has a Gaussian profile and is focused at the focal depth in the photoceram.

20. The method of claim 13 wherein, the UV wavelength is at an edge between the weak absorption region and the strong absorption region of the photoceram, the illumination step exposes the focal volume for the predetermined number of pulses having a per pulse fluence level over a predetermined pulse width time, the per pulse fluence level and the predetermined number of pulses provide an exposure dose above a minimum critical dose necessary for converting the photoceram into the amorphous exposed material, and the minimum critical dose is a nonlinear function of the per pulse fluence level.

* * * * *